United States Patent
Wilcox et al.

(10) Patent No.: US 9,219,202 B2
(45) Date of Patent: Dec. 22, 2015

(54) SEMICONDUCTOR LIGHT EMITTING DEVICES INCLUDING RED PHOSPHORS THAT EXHIBIT GOOD COLOR RENDERING PROPERTIES AND RELATED RED PHOSPHORS

(71) Applicant: Cree, Inc., Durham, NC (US)

(72) Inventors: Robert Wilcox, Rolesville, NC (US); Brian Collins, Holly Springs, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/255,607

(22) Filed: Apr. 17, 2014

(65) Prior Publication Data
US 2014/0312376 A1    Oct. 23, 2014

Related U.S. Application Data

(60) Provisional application No. 61/813,977, filed on Apr. 19, 2013, provisional application No. 61/871,655, filed on Aug. 29, 2013.

(51) Int. Cl.
| | |
|---|---|
| *H01L 31/02* | (2006.01) |
| *H01L 33/50* | (2010.01) |
| *C09K 11/77* | (2006.01) |

(52) U.S. Cl.
CPC .......... *H01L 33/504* (2013.01); *C09K 11/7734* (2013.01); *C09K 11/7774* (2013.01)

(58) Field of Classification Search
CPC ............................ H01L 23/011; H01L 23/008
USPC .............. 257/98, 99, 103, 347, 415, E23.011, 257/31.013, 33.005, 8
See application file for complete search history.

(56) References Cited

U.S. PATENT DOCUMENTS

| | | | |
|---|---|---|---|
| 6,600,175 B1 | 7/2003 | Baretz et al. | |
| 6,621,211 B1 | 9/2003 | Srivastava et al. | |
| 6,700,322 B1 | 3/2004 | Duggal et al. | |
| 7,252,788 B2 * | 8/2007 | Nagatomi et al. | ...... 252/301.4 F |
| 7,540,977 B2 * | 6/2009 | Hirosaki et al. | ........ 252/301.4 F |
| 8,597,545 B1 * | 12/2013 | Liu et al. | .................. 252/301.4 F |
| 8,644,611 B2 * | 2/2014 | Natarajan et al. | ............. 382/186 |
| 8,809,893 B2 * | 8/2014 | Choi et al. | ....................... 257/99 |
| 2005/0093007 A1 | 5/2005 | Steigerwald et al. | |
| 2006/0284196 A1 | 12/2006 | Setlur et al. | |

(Continued)

FOREIGN PATENT DOCUMENTS

WO    WO 2012/077448 A1    6/2012

*Primary Examiner* — Michael Lebentritt
(74) *Attorney, Agent, or Firm* — Myers Bigel Sibley & Sajovec, P.A.

(57) ABSTRACT

A light emitting device includes a light emitting diode ("LED") that emits light having a dominant wavelength in the blue color range, and a recipient luminophoric medium that is configured to down-convert at least some of the light emitted by the LED. The recipient luminophoric medium includes a green phosphor that down-converts the radiation emitted by the LED to radiation having a peak wavelength that is between about 525 nanometers and about 550 nanometers, a yellow phosphor having a wavelength peak that is between about 550 nanometers and about 580 nanometers, and a red $(Ca_{1-x-y}Sr_xEu^{2+}_y)SiAlN_3$ phosphor. The $(Ca_{1-x-y}Sr_xEu^{2+}_y)SiAlN_3$ phosphor has a europium content y of between about 0.003 and 0.009 and a strontium content x of between about 0.150 and 0.300.

18 Claims, 9 Drawing Sheets

(56) References Cited

U.S. PATENT DOCUMENTS

| | | | |
|---|---|---|---|
| 2007/0158668 A1 | 7/2007 | Tarsa et al. | |
| 2007/0259206 A1 | 11/2007 | Oshio | |
| 2008/0143246 A1* | 6/2008 | Hirosaki et al. | 313/503 |
| 2008/0173884 A1 | 7/2008 | Chitnis et al. | |
| 2008/0179611 A1 | 7/2008 | Chitnis et al. | |
| 2008/0191610 A1 | 8/2008 | Oshio | |
| 2008/0203901 A1* | 8/2008 | Bukesov et al. | 313/503 |
| 2009/0108281 A1 | 4/2009 | Keller et al. | |
| 2009/0184616 A1 | 7/2009 | Van de Ven et al. | |
| 2010/0123104 A1 | 5/2010 | Collins et al. | |
| 2011/0220929 A1 | 9/2011 | Collins et al. | |
| 2012/0062105 A1* | 3/2012 | Li et al. | 313/503 |
| 2012/0193649 A1 | 8/2012 | Donofrio et al. | |
| 2012/0256533 A1* | 10/2012 | Seto et al. | 313/498 |
| 2012/0286304 A1 | 11/2012 | LeToquin et al. | |
| 2012/0313124 A1 | 12/2012 | Clatterbuck et al. | |
| 2013/0168606 A1* | 7/2013 | Hirosaki et al. | 252/301.4 F |
| 2013/0207538 A1* | 8/2013 | Hirosaki et al. | 313/504 |
| 2013/0241395 A1* | 9/2013 | Matsuda et al. | 313/503 |
| 2013/0257266 A1 | 10/2013 | Ishizaki | |
| 2014/0008680 A1* | 1/2014 | Won et al. | 257/98 |
| 2014/0042898 A1* | 2/2014 | Seto et al. | 313/503 |
| 2014/0084783 A1* | 3/2014 | Liu et al. | 313/503 |

\* cited by examiner

SEMICONDUCTOR LIGHT EMITTING DEVICES INCLUDING RED PHOSPHORS THAT EXHIBIT GOOD COLOR RENDERING PROPERTIES AND RELATED RED PHOSPHORS

RELATED APPLICATIONS

The present application claims the benefit of and priority to U.S. Provisional Patent Application No. 61/813,977, filed Apr. 19, 2013, entitled Semiconductor Light Emitting Devices Including Red Phosphors That Exhibit Good Color Rendering Properties And Related Red Phosphors, and to U.S. Provisional Application No. 61/871,655, filed Aug. 29, 2013, entitled "Semiconductor Light Emitting Devices Including Multiple Red Phosphors That Exhibit Good Color Rendering Properties With Increased Brightness," the disclosures of which are hereby incorporated herein by reference in their entirety.

BACKGROUND

The present invention relates to light emitting devices and, more particularly, to semiconductor light emitting devices that include red phosphors that exhibit good color rendering properties and can achieve high luminous flux values.

Light emitting diodes ("LEDs") are solid state lighting devices that are capable of generating light. LEDs include both semiconductor-based LEDs and organic LEDs (which are often referred to as OLEDs). Semiconductor-based LEDs generally include a plurality of semiconductor layers that may be epitaxially grown on a semiconductor or non-semiconductor substrate such as, for example, sapphire, silicon, silicon carbide, gallium nitride or gallium arsenide substrates. One or more semiconductor p-n junctions are formed in these epitaxial layers. When a sufficient voltage is applied across the p-n junction, electrons in the n-type semiconductor layers and holes in the p-type semiconductor layers flow toward the p-n junction. As the electrons and holes flow toward each other, some of the electrons will recombine. Each time this occurs, a photon of light is emitted, which is how LEDs generate light. The wavelength distribution of the light generated by an LED generally depends on the semiconductor materials used and the structure of the thin epitaxial layers that make up the "active region" of the device (i.e., the area where the electrons and holes recombine).

The "peak" wavelength of an LED refers to the single wavelength where the radiometric emission spectrum of the LED reaches its maximum as detected by a photo-detector. LEDs typically have a narrow wavelength distribution that is tightly centered about their "peak" wavelength. For example, the spectral power distributions of a typical LED may have a full width of, for example, about 10-30 nm, where the width is measured at half the maximum illumination (referred to as the full width half maximum or "FWHM" width). LEDs may also be identified by their "dominant" wavelength, which is the wavelength where the radiometric emission spectrum of the LED, as perceived by the human eye, reaches its maximum value. The dominant wavelength thus differs from the peak wavelength in that the dominant wavelength takes into account the sensitivity of the human eye to different wavelengths of light.

As most LEDs are nearly monochromatic light sources that appear to emit light having a single color, LED-based light emitting devices that include multiple LEDs that emit light of different colors have been used in order to provide solid state light emitting devices that generate white light. In these devices, the different colors of light emitted by the individual LEDs combine to produce a desired intensity and/or color of white light. For example, by simultaneously energizing red, green and blue light emitting LEDs, the resulting combined light may appear white, or nearly white, depending on, for example, the relative intensities, peak wavelength and spectral power distributions of the source red, green and blue LEDs.

White light may also be produced by surrounding a single-color LED with a luminescent material that converts some of the light emitted by the LED to light of other colors. The combination of the light emitted by the single-color LED that passes through the luminescent material along with the light of different colors that is emitted by the luminescent material may produce a white or near-white light. For example, a single blue-emitting LED chip (e.g., made of indium gallium nitride and/or gallium nitride) may be used in combination with a yellow phosphor, polymer or dye such as for example, cerium-doped yttrium aluminum garnet (which has the chemical formula $Y_3Al_5O_{12}$:Ce, which is referred to herein as a "YAG:Ce" phosphor), that "down-converts" the wavelength of some of the blue light emitted by the LED, changing its color to yellow. In a blue LED/yellow phosphor lamp, the blue LED produces an emission with a dominant wavelength of, for example, about 450-460 nanometers, and the phosphor produces yellow fluorescence with a peak wavelength of, for example, about 550 nanometers in response to the blue emission. Some of the blue light passes through the phosphor (and/or between the phosphor particles) without being down-converted, while a substantial portion of the light is absorbed by the phosphor, which becomes excited and emits light across a broad spectrum that has a peak wavelength in the yellow color range (i.e., the blue light is down-converted to yellow light). The combination of blue light and yellow light may appear white to an observer. Such light is typically perceived as being cool white in color. In another approach, light from a violet or ultraviolet emitting LED may be converted to white light by surrounding the LED with multicolor phosphors or dyes. In either case, red-emitting phosphor particles may also be added to improve the color rendering properties of the light, i.e., to make the light appear more "warm," particularly when the single color LED emits blue or ultraviolet light.

LEDs are used in a host of applications including, for example, backlighting for liquid crystal displays, indicator lights, automotive headlights, flashlights, specialty lighting applications and even as replacements for conventional incandescent and/or fluorescent lighting in general lighting and illumination applications. In many of these applications, it may be desirable to use luminescent materials to provide a lighting source that generates light having specific properties.

SUMMARY

A light emitting device according to some embodiments includes a light emitting diode ("LED") that emits light having a dominant wavelength in the blue color range; and a recipient luminophoric medium that is configured to down-convert at least some of the light emitted by the LED. The recipient luminophoric medium includes a green phosphor that down-converts the radiation emitted by the LED to radiation having a peak wavelength that is between about 525 nanometers and about 550 nanometers; a yellow phosphor having a wavelength peak that is between about 550 nanometers and about 580 nanometers; and a red $(Ca_{1-x-y}Sr_xEu^{2+}{}_y)SiAlN_3$ phosphor, wherein the $(Ca_{1-x-y}Sr_xEu^{2+}{}_y)SiAlN_3$ phosphor has a europium content y of between about 0.003 and 0.009 and a strontium content x of between about 0.150 and 0.300.

The green phosphor may be a $Y_aCe_bAl_cGa_dO_z$ phosphor ("gallium substituted YAG:Ce phosphor"), a $Lu_3Al_5O_{12}$:Ce phosphor ("LuAG:Ce phosphor"), or a combination of a gallium substituted YAG:Ce phosphor and a LuAG:Ce phosphor.

The yellow phosphor may include a $Y_aCe_bAl_cO_z$ phosphor ("YAG:Ce phosphor").

The europium content of the $(Ca_{1-x}Sr_x)SiAlN_3$:$Eu^{2+}$ phosphor may be at between about 0.005 and 0.007.

A ratio by weight of the non-red phosphor particles to the red phosphor particles in the recipient luminophoric medium may be from about 13:1 to about 4:1.

The recipient luminophoric medium may be free of yellow phosphors, and in particular may be free of YAG:Ce phosphors.

The recipient luminophoric medium and the LED may be configured to together emit white light having a correlated color temperature between about 2500K and about 4500K and a CRI R9 of at least 85.

The LED may emit light having a dominant wavelength between 440 nm and 465 nm.

The recipient luminophoric medium and the LED may be configured to together emit white light having a correlated color temperature of about 4000K, a CRI Ra that is greater than 90, and a CRI R9 that is greater than 85.

In some embodiments, the recipient luminophoric medium and the LED may be configured to together emit white light having a correlated color temperature that is less than 4000K, a CRI Ra that is greater than 90, and a CRI R9 that is greater than 90.

A phosphor composition according to some embodiments for use with a light emitting device includes a red phosphor comprising a plurality of $(Ca_{1-x-y}Sr_xEu^{2+}_y)SiAlN_3$ phosphor particles, wherein x is between about 0.150 and about 0.300, and wherein y is between about 0.003 and about 0.010; a green phosphor that down-converts blue light emitted by the light emitting device to radiation having a peak wavelength that is between about 525 nanometers and about 550 nanometers; and a yellow phosphor that down-converts blue light emitted by the light emitting device to radiation having a peak wavelength that is between about 550 nanometers and about 580 nanometers In some embodiments, x is between about 0.200 and about 0.250, and wherein y is between about 0.005 and about 0.007. In further embodiments, x is about 0.200, and wherein y is about 0.006.

A ratio by weight of the green phosphor particles or the green+yellow phosphor particles to the $(Ca_{1-x-y}Sr_xEu^{2+}_y)SiAlN_3$ phosphor particles may be from about 13:1 to about 4:1.

In some embodiments, the phosphor composition may be free of yellow phosphors, and in particular may be free of YAG:Ce phosphors.

A light emitting device according to some embodiments includes a light emitting diode that emits light having a dominant wavelength in the blue color range; and a recipient luminophoric medium that is configured to down-convert at least some of the light emitted by the LED. The recipient luminophoric medium includes a red $(Ca_{1-x-y}Sr_xEu^{2+}_y)SiAlN_3$ phosphor, wherein the $(Ca_{1-x-y}Sr_xEu^{2+}_y)SiAlN_3$ phosphor has a europium content y of between about 0.003 and 0.010 and a strontium content of between about 0.200 and 0.250. The device may have a CRI Ra value that is greater than 95 and a CRI R9 value that is greater than 85, and in some cases greater than 90 or 95.

The device may further include an additional phosphor that emits light other than red light when stimulated by radiation emitted by the LED. For example, the device may further include a green phosphor that down-converts the radiation emitted by the LED to radiation having a peak wavelength that is between about 525 nanometers and about 550 nanometers. The green phosphor may include, for example, a gallium-substituted YAG:Ce phosphor and/or a LuAG:Ce phosphor. Other phosphors, including yellow phosphors may be present in amounts that still allow for high CRI Ra and CRI R9 performance.

DETAILED DESCRIPTION

Solid state light emitting devices according to embodiments of the present invention may include III-V nitride (e.g., gallium nitride) based LEDs or lasers fabricated on a silicon carbide, sapphire or gallium nitride substrates such as those devices manufactured and/or sold by Cree, Inc. of Durham, N.C. Such LEDs and/or lasers may (or may not) be configured to operate such that light emission occurs through the substrate in a so-called "flip chip" orientation. Solid state light emitting devices according to embodiments of the present invention include both vertical devices with a cathode contact on one side of the chip, and an anode contact on an opposite side of the chip and devices in which both contacts are on the same side of the device.

Visible light may include light having many different wavelengths. The apparent color of visible light can be illustrated with reference to a two-dimensional chromaticity diagram, such as the 1931 CIE Chromaticity Diagram illustrated in FIG. 1. Chromaticity diagrams provide a useful reference for defining colors as weighted sums of colors.

Figure 1:
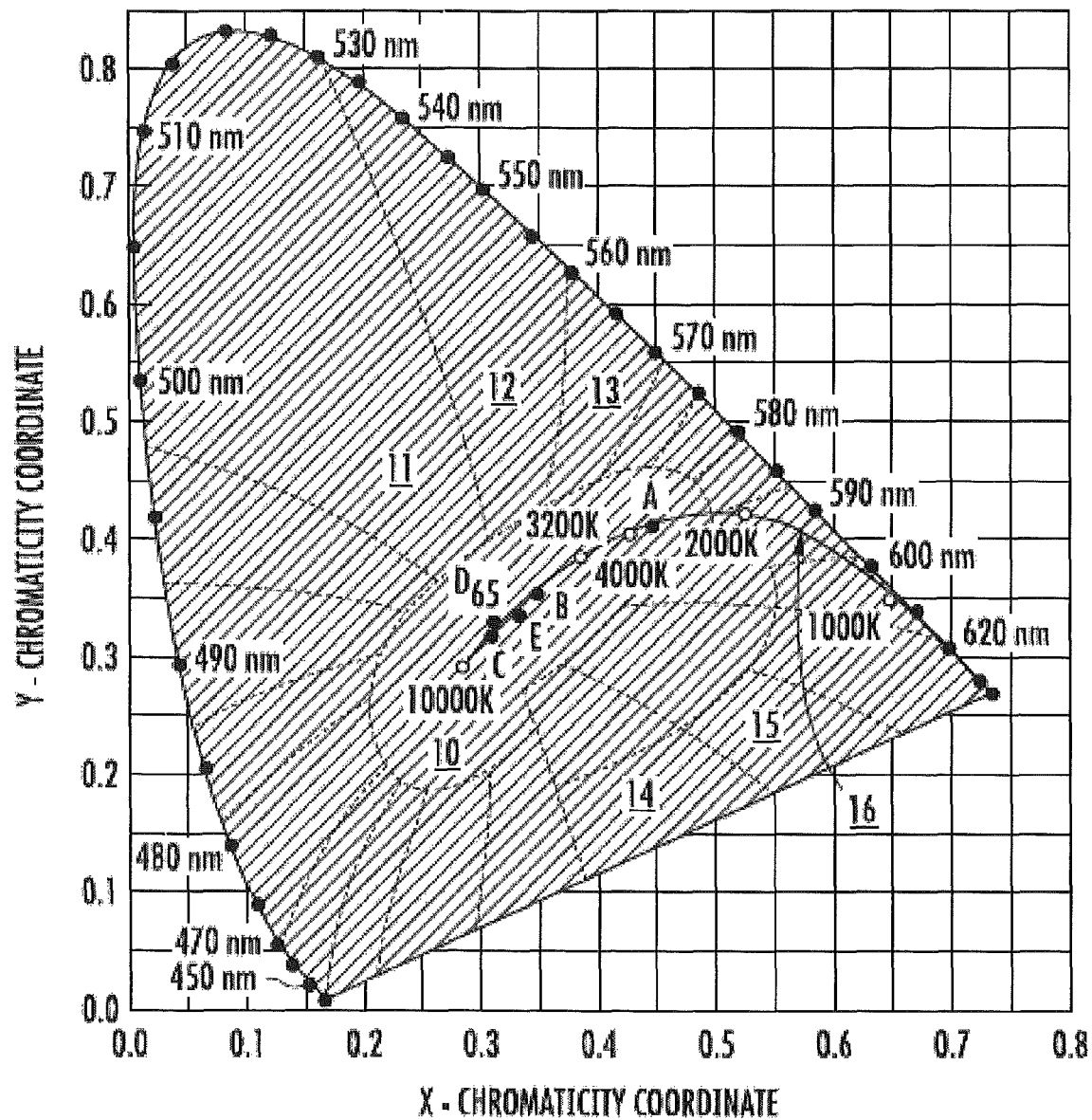
FIG. 1 is a graph of a 1931 CIE Chromaticity Diagram illustrating the location of the planckian locus.

As shown in FIG. 1, colors on a 1931 CIE Chromaticity Diagram are defined by x and y coordinates (i.e., chromaticity coordinates, or color points) that fall within a generally U-shaped area. Colors on or near the outside of the area are saturated colors composed of light having a single wavelength, or a very small wavelength distribution. Colors on the interior of the area are unsaturated colors that are composed of a mixture of different wavelengths. White light, which can be a mixture of many different wavelengths, is generally found near the middle of the diagram, in the region labeled 10 in FIG. 1. There are many different hues of light that may be considered "white," as evidenced by the size of the region 10. For example, some "white" light, such as light generated by sodium vapor lighting devices, may appear yellowish in color, while other "white" light, such as light generated by some fluorescent lighting devices, may appear more bluish in color.

Light that generally appears green or includes a substantial green component is plotted in the regions 11, 12 and 13 that are above the white region 10, while light below the white region 10 generally appears pink, purple or magenta. For example, light plotted in regions 14 and 15 of FIG. 1 generally appears magenta (i.e., red-purple or purplish red).

It is further known that a binary combination of light from two different light sources may appear to have a different color than either of the two constituent colors. The color of the combined light may depend on the wavelengths and relative intensities of the two light sources. For example, light emitted by a combination of a blue source and a red source may appear purple or magenta to an observer. Similarly, light emitted by a combination of a blue source and a yellow source may appear white to an observer.

Each point in the graph of FIG. 1 is referred to as the "color point" of a light source that emits a light having that color. As shown in FIG. 1 a locus of color points that is referred to as the "black-body" locus 16 exists which corresponds to the location of color points of light emitted by a black-body radiator that is heated to various temperatures. The black-body locus 16 is also referred to as the "planckian" locus because the chromaticity coordinates (i.e., color points) that lie along the black-body locus obey Planck's equation: $E(\lambda)=A\lambda^{-5}/(e^{B/T}-1)$, where E is the emission intensity, $\lambda$ is the emission wavelength, T is the color temperature of the black-body and A and B are constants. Color coordinates that lie on or near the black-body locus 16 may yield pleasing white light to a human observer.

As a heated object becomes incandescent, it first glows reddish, then yellowish, then white, and finally bluish. This occurs because the wavelength associated with the peak radiation of the black-body radiator becomes progressively shorter with increased temperature, consistent with the Wien Displacement Law. Illuminants that produce light which is on or near the black-body locus 16 can thus be described in terms of their correlated color temperature (CCT). As used herein, the term "white light" refers to light that is perceived as white, is within a 7-step MacAdam ellipse of the black-body locus on a 1931 CIE chromaticity diagram, and has a CCT ranging from 2000K to 10,000K. White light with a CCT of 4000K may appear yellowish in color, while white light with a CCT of 8000K or more may appear more bluish in color, and may be referred to as "cool" white light. "Warm" white light may be used to describe white light with a CCT of between about 2500K and 4500K, which is more reddish or yellowish in color. Warm white light is generally a pleasing color to a human observer. Warm white light with a CCT of 2500K to 3300K may be preferred for certain applications.

The ability of a light source to accurately reproduce color in illuminated objects is typically characterized using the color rendering index ("CRI Ra" or "CRI"). The CRI Ra of a light source is a modified average of the relative measurements of how the color rendition of an illumination system compares to that of a reference black-body radiator when illuminating eight reference colors that are referred to as R1 through R8. Thus, the CRI Ra is a relative measure of the shift in surface color of an object when lit by a particular lamp. The CRI Ra equals 100 if the color coordinates of a set of test colors being illuminated by the illumination system are the same as the coordinates of the same test colors being irradiated by the black-body radiator. Daylight generally has a CRI Ra of nearly 100, incandescent bulbs have a CRI Ra of about 95, fluorescent lighting typically has a CRI Ra of about 70 to 85, while monochromatic light sources have a CRI Ra of essentially zero. Light sources for general illumination applications with a CRI Ra of less than 50 are generally considered very poor and are typically only used in applications where economic issues preclude other alternatives. Light sources with a CRI Ra value between 70 and 80 have application for general illumination where the colors of objects are not important. For many general interior illumination applications, a CRI Ra value of greater than 80 is acceptable. A light source with color coordinates within a 4-step MacAdam ellipse of the black-body locus 4 and a CRI Ra value that exceeds 85 is more suitable for general illumination purposes. Light sources with CRI Ra values of more than 90 provide greater color quality and may be used, for example, in retail settings.

For backlight, general illumination and various other applications, it is often desirable to provide a lighting source that generates white light having a relatively high CRI Ra, so that objects illuminated by the lighting source may appear to have more natural coloring to the human eye. Accordingly, such lighting sources may typically include an array of solid state lighting devices including red, green and blue light emitting devices that generate a combined light that may appear white, or nearly white, depending on the color points and relative intensities of the red, green and blue sources. However, even light that is a combination of red, green and blue emitters may have a low CRI Ra, particularly if the emitters generate saturated light, because such light may lack contributions from many visible wavelengths.

As noted above, CRI Ra is an average color rendering value for eight specific sample colors that are generally referred to as R1-R8. Additional sample colors R9-R15 are also often used in evaluating the color rendering properties of a light source. The sample color R9 is the saturated red color, and it is generally known that the ability to reproduce red colors well is key for accurately rendering colors, as the color red is often found mixed into processed colors. Accordingly, all else being equal, lamps with high R9 values tend to produce the most vivid colors.

Another important performance parameter for an LED lighting source is the intensity of the light emitted, which is referred to as the radiant flux of the device. However, as the human eye has varying sensitivity to different wavelengths of light, the intensity of the light emitted by a lighting source is most typically measured in terms of the lighting source's "luminous flux," which is a measure of the power of the light emitted by a light source as perceived by a human observer. The luminous flux of a light source is typically measured in lumens (lm). The luminous flux of a light source differs from the radiant flux of the light source in that the radiant flux measures the total power emitted, while the luminous flux weights the power of the light emitted at each wavelength based on a luminosity function which represents the response of the human eye for each different wavelength. The human eye has the greatest sensitivity to light that is at a wavelength of about 555 nm.

Because of the varying sensitivity of the human eye to light of different wavelengths, there tends to be a tradeoff between the intensity of the light emitted by an LED lighting source and the CRI of the light emitted. For example, since the human eye is most sensitive to light at a wavelength of about 555 nm, a monochromatic light source at 555 nm would exhibit a high luminous flux value. However, in order to obtain high CRI values, it is generally necessary to have light contribution across a wide range of wavelengths, including wavelengths that are relatively far away from 555 nm where the peak sensitivity of light to the human eye occurs. Because the human eye has reduced sensitivity to the wavelengths on either end of the visible light spectrum, the light contributions that are often added to improve the CRI of a device may result in a decrease in the luminous flux of the device.

According to some embodiments of the present invention, LED-based light emitting devices are provided that may exhibit improved luminous flux values while maintaining good color rendering properties (e.g., a CRI Ra value of greater than 80). These light emitting devices may include luminophoric mediums that include at least three different types of luminescent materials. A "luminescent material" refers to a material such as a phosphor that absorbs light having first wavelengths and re-emits light having second wavelengths that are different from the first wavelengths, regardless of the delay between absorption and re-emission and regardless of the wavelengths involved. For example, "down-conversion" luminescent materials may absorb light having shorter wavelengths and re-emit light having longer wavelengths. Herein, the term "luminophoric medium" refers to a medium which includes one or more luminescent materials. A wide variety of luminescent materials are known, with exemplary materials being disclosed in, for example, U.S. Pat. No. 6,600,175 and U.S. Patent Application Publication No. 2009/0184616. In addition to phosphors, other luminescent materials include scintillators, day glow tapes, nano-phosphors, quantum dots, fluorescent materials, phosphorescent materials and inks that glow in the visible spectrum upon illumination with (e.g., ultraviolet) light. Exemplary luminophoric mediums include layers that include luminescent materials that are coated on solid state light emitting devices or lenses thereof and clear encapsulants (e.g., epoxy-based or silicone-based curable resin) that include luminescent materials that are arranged to partially or fully cover one or more solid state light emitting devices.

In some embodiments, the light emitting devices may comprise a blue or ultraviolet LED that has a luminophoric medium that includes a green phosphor, a yellow phosphor, and a red phosphor. Herein a "green phosphor" refers to a phosphor that emits light having a peak wavelength in the green color range (when, for example, excited by the blue or ultraviolet LED light source), a "yellow phosphor" refers to a phosphor that emits light having a peak wavelength in the yellow color range, and a "red phosphor" refers to a phosphor that emits light having a peak wavelength in the red color range. In some embodiments, the green phosphor may include a $Y_aCe_bAl_cGa_dO_z$ phosphor (referred to herein as a "gallium-substituted YAG:Ce" phosphor) or a $Lu_3Al_5O_{12}$:Ce phosphor or a combination of a gallium substituted YAG:Ce phosphor and a LuAG:Ce phosphor.

The yellow phosphor may include a YAG:Ce phosphor, and the red phosphor may include a $(Ca_{1-x-y}Sr_xEu^{2+}_y)SiAlN_3$ phosphor.

In some applications, it may be beneficial to provide a light emitting device that has higher CRI R9 performance, even at the expense of luminous flux. Accordingly, some embodiments provide a phosphor composition that can obtain higher CRI R9 performance when coupled with a blue light emitting diode.

Higher CRI R9 performance may be obtained by increasing the relative amount of red phosphor in the phosphor composition. For example, in some embodiments, a ratio by weight of the non-red phosphor particles (e.g., the green phosphor particles or the green+yellow phosphor particles) to the red phosphor particles may be from about 13:1 to about 4:1.

Furthermore, a green phosphor used in the LED may have a somewhat longer emission wavelength than a phosphor used in the embodiments described above.

Some embodiments obtain high CRI Ra and CRI R9 performance using a blue LED combined with a green phosphor and a red phosphor, wherein the green phosphor has an emission peak in the range of about 525 nm to 550 nm, and in some embodiments between about 530 nm and 540 nm. The yellow phosphor may have a peak wavelength that is between about 550 nm and 580 nm. The red phosphor may include a red $(Ca_{1-x-y}Sr_xEu^{2+}_y)SiAlN_3$ phosphor, wherein the $(Ca_{1-x-y}Sr_xEu^{2+}_y)SiAlN_3$ phosphor has a europium content y of between about 0.003 and 0.009 and a strontium content x of between about 0.150 and 0.300. In some embodiments, the europium content of the $(Ca_{1-x}Sr_x)SiAlN_3$:Eu$^{2+}$ phosphor may be between about 0.005 and 0.007. In some embodiments, the strontium content of the $(Ca_{1-x}Sr_x)SiAlN_3$:Eu$^{2+}$ phosphor may be between about 0.200 and 0.250.

In some embodiments, the yellow phosphor may be omitted from the composition in order to obtain a desired color point for the light output by the LED with the higher red phosphor composition.

In some embodiments, the green phosphor may comprise LuAG:Ce phosphor particles having an emission wavelength between about 535 nm and 545 nm. The red phosphor may comprise a $(Ca_{1-x-y}Sr_xEu^{2+}_y)SiAlN_3$ phosphor having relative amounts of strontium and europium that are selected to provide an emission wavelength that is between about 645 nm and 660 nm. In particular, the $(Ca_{1-x-y}Sr_xEu^{2+}_y)SiAlN_3$ phosphor may have a europium content of about 0.003 to 0.009, and may have a strontium content of about 0.200 to about 0.250.

In some embodiments, the $(Ca_{1-x-y}Sr_xEu^{2+}_y)SiAlN_3$ phosphor may have the following strontium, europium and calcium concentrations:

0.150<Sr<0.300

0.003<Eu<0.010

0.794<Ca<0.847

In particular embodiments, the $(Ca_{1-x-y}Sr_xEu^{2+}_y)SiAlN_3$ phosphor may have the a strontium concentration of about 0.200, a europium concentration of about 0.006, and a calcium concentration of 0.794. These $(Ca_{1-x-y}Sr_xEu^{2+}_y)SiAlN_3$ phosphors may have a peak wavelength centered around about 650 nm.

In addition to the red phosphors described herein, other suitable nitride-based red phosphors are described in U.S. Publication No. 2010/0123104, entitled Phosphor Composition, the disclosure of which is incorporated herein by reference in its entirety.

Suitable LuAG:Ce phosphors are described, for example, in U.S. Publication No. 2012/0286304, entitled Recipient Luminophoric Mediums Having Narrow Spectrum Luminescent Materials and Related Semiconductor Light Emitting Devices and Methods, the disclosure of which is incorporated herein by reference in its entirety.

Figure 2:
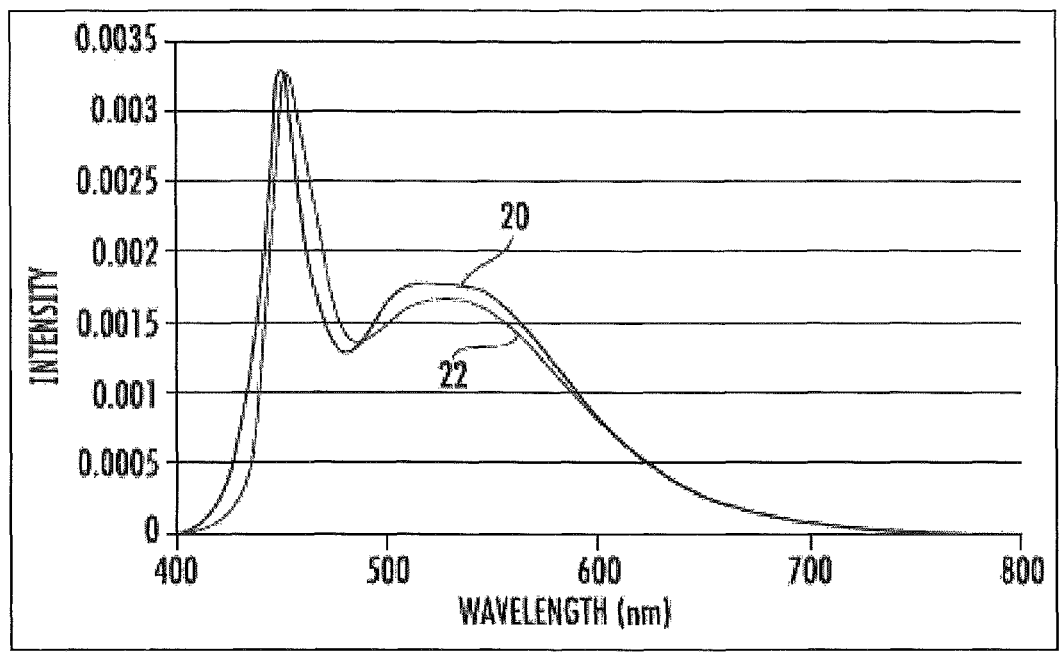
FIG. 2 is graph comparing the luminous flux of a light emitting device that includes a blue LED and an $Lu_3Al_5O_{12}$:Ce phosphor to a light emitting device that includes a comparable blue LED and a $Y_aCe_bAl_cGa_dO_z$ phosphor.

FIG. 2 is graph comparing the luminous flux of a light emitting device that includes a blue LED and an $Lu_3Al_5O_{12}$:Ce phosphor to a light emitting device that includes a comparable blue LED and a $Y_aCe_bAl_cGa_dO_z$ phosphor. In the first device (curve 20), the green phosphor comprises a conventional LuAG:Ce phosphor, while in the second device (curve 22) the green phosphor comprises the above-described gallium substituted YAG:Ce phosphor. In each case, the blue LED had the same peak wavelength. The blue LED in each device also had the same dominant wavelength.

As shown in FIG. 2, the peak emission in the blue color range of the first device (i.e., the device with the LuAG:Ce phosphor) is to the left of the peak emission in the blue color range of the second device that includes the above-described gallium substituted YAG:Ce phosphor, even though the blue LEDs in each device had the same dominant wavelength. This shows that the gallium substituted YAG:Ce phosphor is absorbing more light at the lower wavelengths in the blue color range as compared to the LuAG:Ce phosphor.

Figure 3:
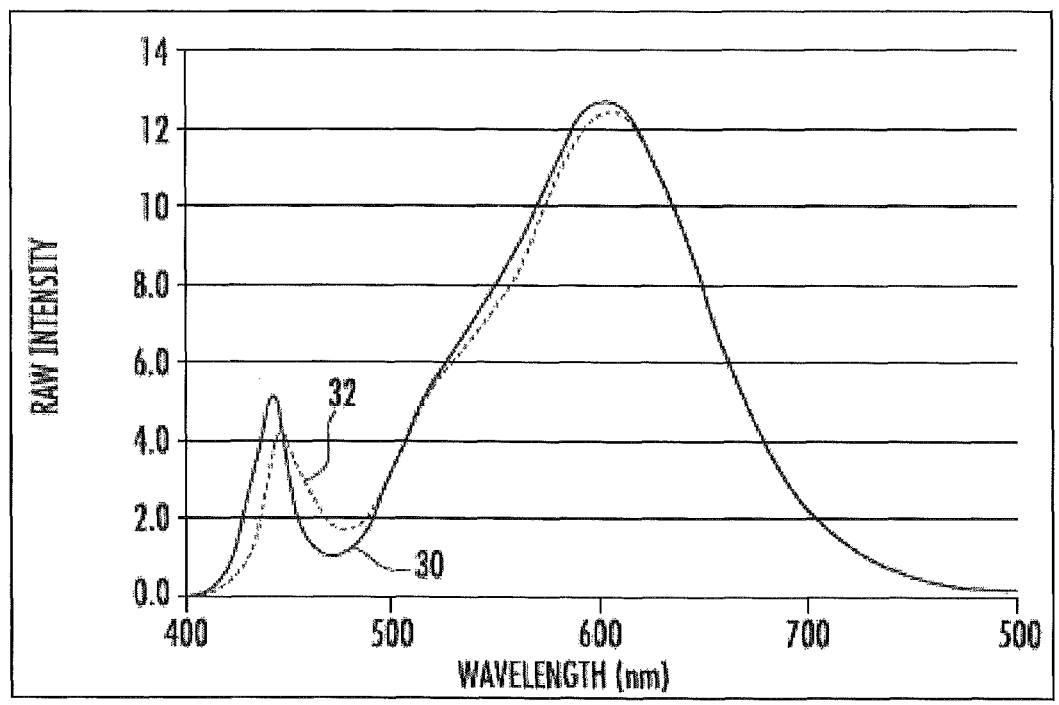
FIG. 3 is graph comparing the luminous flux of a light emitting device that includes a blue LED and a luminophoric medium that includes a YAG:Ce phosphor, an $Lu_3Al_5O_{12}$:Ce phosphor and a $(Ca_{1-x-y}Sr_xEu^{2+}_y)SiAlN_3$ phosphor to a light emitting device that includes a comparable blue LED and a luminophoric medium that includes a YAG:Ce phosphor, a $Y_aCe_bAl_cGa_dO_z$ phosphor and a $(Ca_{1-x-y}Sr_xEu^{2+}_y)SiAlN_3$.

FIG. 3 is graph comparing the luminous flux of a light emitting device that includes a blue LED and a luminophoric medium that includes a YAG:Ce phosphor, an $Lu_3Al_5O_{12}$:Ce phosphor and a $(Ca_{1-x-y}Sr_xEu^{2+}{}_y)SiAlN_3$ phosphor to a light emitting device that includes a comparable blue LED and a luminophoric medium that includes a YAG:Ce phosphor, a $Y_aCe_bAl_cGa_dO_z$ phosphor and a $(Ca_{1-x-y}Sr_xEu^{2+}{}_y)SiAlN_3$. In the first device (curve 30), the green phosphor comprises a conventional LuAG:Ce phosphor, while in the second device (curve 32) the green phosphor comprises the above-described gallium substituted YAG:Ce phosphor. The same yellow and red phosphors are used in each device, and in each case, the blue LED had the same peak wavelength and luminous flux As shown in curve 30, FIG. 3, the peak emission in the blue color range of the first device (i.e., the device with the LuAG:Ce phosphor) is once again to the left of the peak emission in the blue color range of the second device (curve 32) that includes the above-described gallium substituted YAG:Ce phosphor. This again shows that the gallium substituted YAG:Ce phosphor is absorbing more light at the lower wavelengths in the blue color range as compared to the LuAG:Ce phosphor. This also illustrates that the addition of the yellow and red phosphors does not impact the absorption characteristics of the gallium substituted YAG:Ce phosphor with respect to the light emitted by the blue LED. As is further shown in FIG. 3, the light emitting device that includes the gallium substituted YAG:Ce phosphor has a lower peak emission in the blue color range (peaking at a value of about 4) as compared to the light emitting device that includes the LuAG:Ce phosphor (which peaks at a value of about 5). Additionally, the light emitting device that includes the gallium substituted YAG:Ce phosphor has generally higher emission in the cyan and low wavelength green color ranges as compared to the light emitting device that includes the LuAG:Ce phosphor. This indicates that the gallium substituted YAG:Ce phosphor is down-converting a greater percentage of the light emitted by the blue LED. As shown in FIG. 3, this tends to smooth out the emission spectra in the lower wavelength ranges, which may generally tend to result in improved CRI Ra performance.

In other embodiments, the green phosphor may include a gallium-substituted YAG:Ce phosphor as described above or as described in U.S. Publication No. 2012/0313124 entitled Gallium-Substituted Yttrium Aluminum Garnet Phosphor And Light Emitting Devices Including The Same, the disclosure of which is incorporated herein by reference in its entirety. The gallium-substituted YAG:Ce phosphor may have an emission peak in the range of about 525 nm to 545 nm, and in some embodiments between about 530 nm and 540 nm.

In some embodiments, a green and yellow phosphor may be included such as a LuAG:Ce or gallium-substituted YAG:Ce phosphor and YAG:Ce phosphor particles.

According to some embodiments, a ratio by weight of the green phosphor or green+yellow phosphor to the red phosphor may be about 13:1 to about 4:1. The ratio of green to red phosphor may depend on the targeted color point and/or the dominant wavelength of the LED that is stimulating the phosphor composition. The dominant wavelength of the LED that is stimulating the phosphor composition may in some cases be about 455 nm to 465 nm, although a wider range could be used. The ratios of 13:1 to 4:1 cover target color points with CCTs from about 5000K to about 2700K. As the CCT of the target color point goes from 5000K to 2700K, the green/red ratio decreases. As the dominant wavelength of the LED that is stimulating the phosphor composition increases, the green/red ratio decreases.

Some embodiments may result in an LED component having a CRI Ra that is greater than about 90, and in some embodiments that is greater than about 95, combined with a CRI R9 value that is greater than about 85 for devices having an emission color temperature of about 4000K or a CRI R9 value that is greater than about 90 for devices having an emission color temperature less than 4000K.

In particular, a light emitting device according to some embodiments includes a light emitting diode that emits light having a dominant wavelength in the blue color range; and a recipient luminophoric medium that is configured to down-convert at least some of the light emitted by the LED. The recipient luminophoric medium includes a red $(Ca_{1-x-y}Sr_xEu^{2+}{}_y)SiAlN_3$ phosphor, wherein the $(Ca_{1-x-y}Sr_xEu^{2+}{}_y)SiAlN_3$ phosphor has a europium content y of between about 0.003 and 0.010 and a strontium content x of between about 0.200 and 0.250. The device may have a CRI Ra value that is greater than 95 and a CRI R9 value that is greater than 85, and in some cases greater than 90 or 95.

The device may further include an additional phosphor that emits light other than red light when stimulated by radiation emitted by the LED. For example, the device may further include a green phosphor that down-converts the radiation emitted by the LED to radiation having a peak wavelength that is between about 525 nanometers and about 545 nanometers. The green phosphor may include, for example, a gallium-substituted YAG:Ce phosphor and/or a LuAG:Ce phosphor. Other phosphors, including yellow phosphors may be present in amounts that still allow for high CRI Ra and CRI R9 performance.

Figure 4:
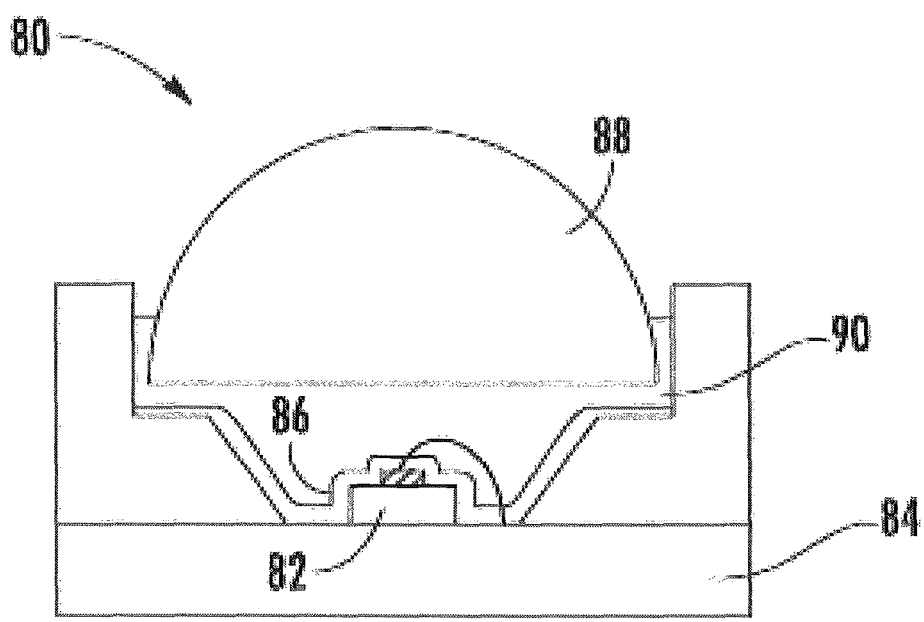
FIG. 4 is a schematic side view of a light emitting device according to certain embodiments of the present invention.

FIG. 4 is a side schematic view of a light emitting device 80 according to some embodiments of the present invention. As shown in FIG. 4, the light emitting device 80 includes an LED 82 that is mounted on a mounting surface 84. A luminophoric medium 86 is provided that is positioned to receive light that is emitted by the LED 82. In the embodiment pictured in FIG. 4, the luminophoric medium 86 is coated on an upper and side surfaces of the LED 82. It will be appreciated, however, that the luminophoric medium may be placed in other locations. For example, in other embodiments, the luminophoric medium 86 may be coated on an interior and/or exterior surface of a lens 88, embodied as an encapsulant material 90 that is provided between the LED 82 and the lens 88 or in any other suitable location where the luminophoric medium 86 may receive at least some of the light emitted by the LED 82 and convert at least some of the emitted light to light having different wavelengths.

The LED 82 may comprise, for example, an LED that emits radiation having a dominant wavelength in the blue color range (e.g., radiation with a dominant wavelength of 425 to 490 nanometers). In some embodiments, the LED may comprise a short wavelength blue LED that emits radiation having a dominant wavelength between about 440 nm and about 465 nm. The luminophoric medium 86 may comprise an encapsulant material such as, for example, silicone that has luminescent materials suspended therein.

Figure 5A:
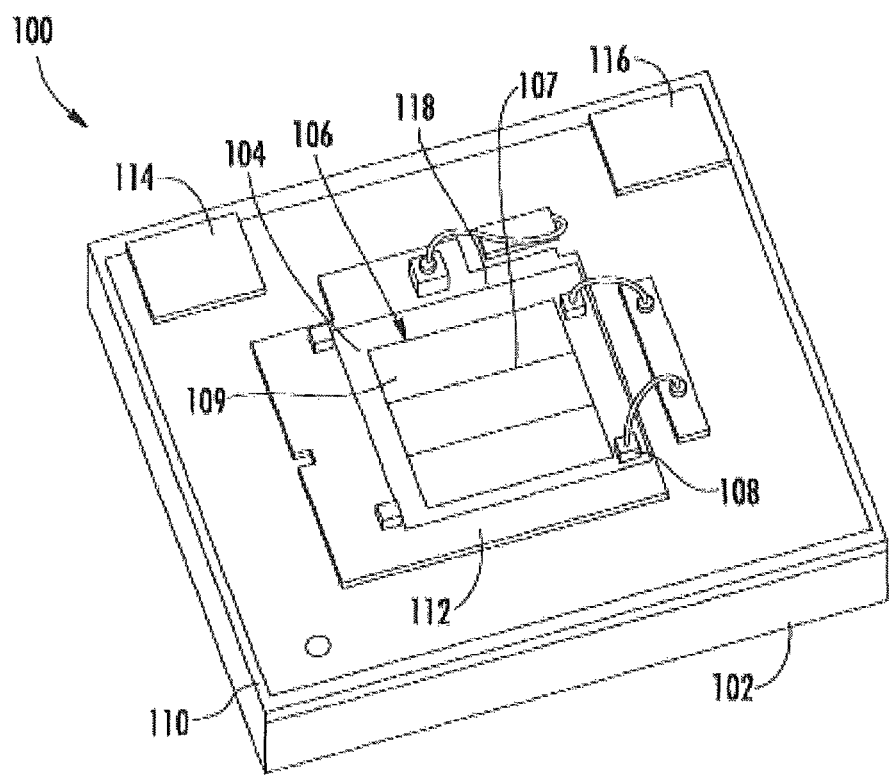
FIGS. 5A-5D are various views of a solid state light emitting device according to embodiments of the present invention.
Figure 5B:
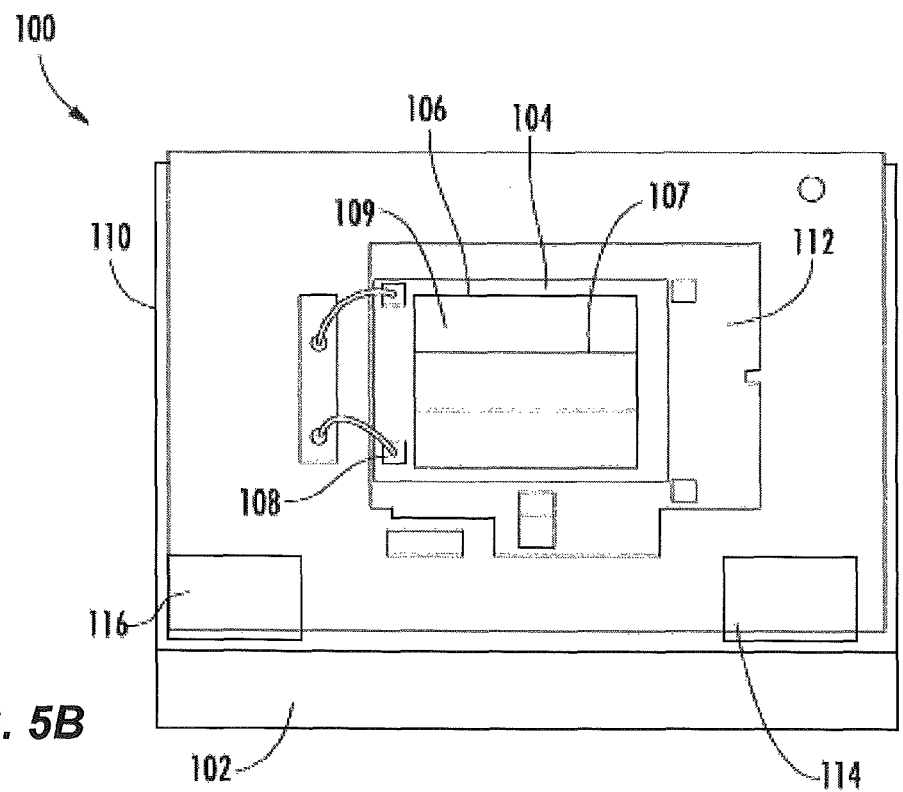
Figure 5C:
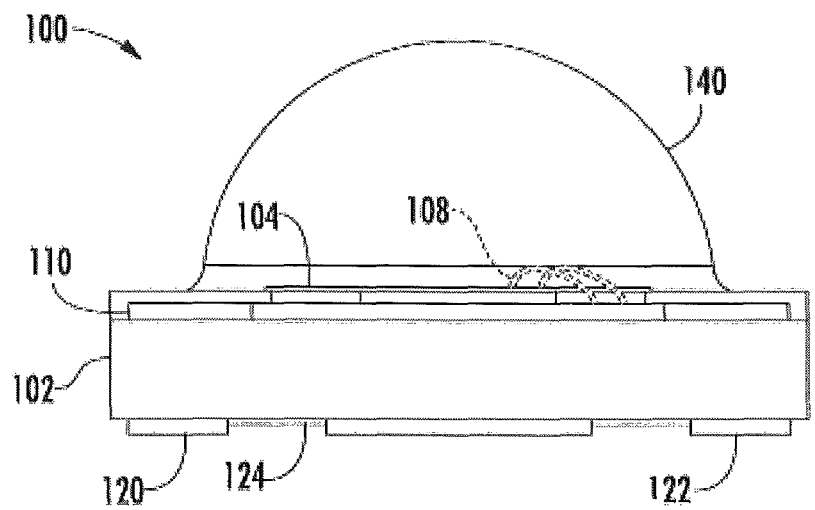
Figure 5D:
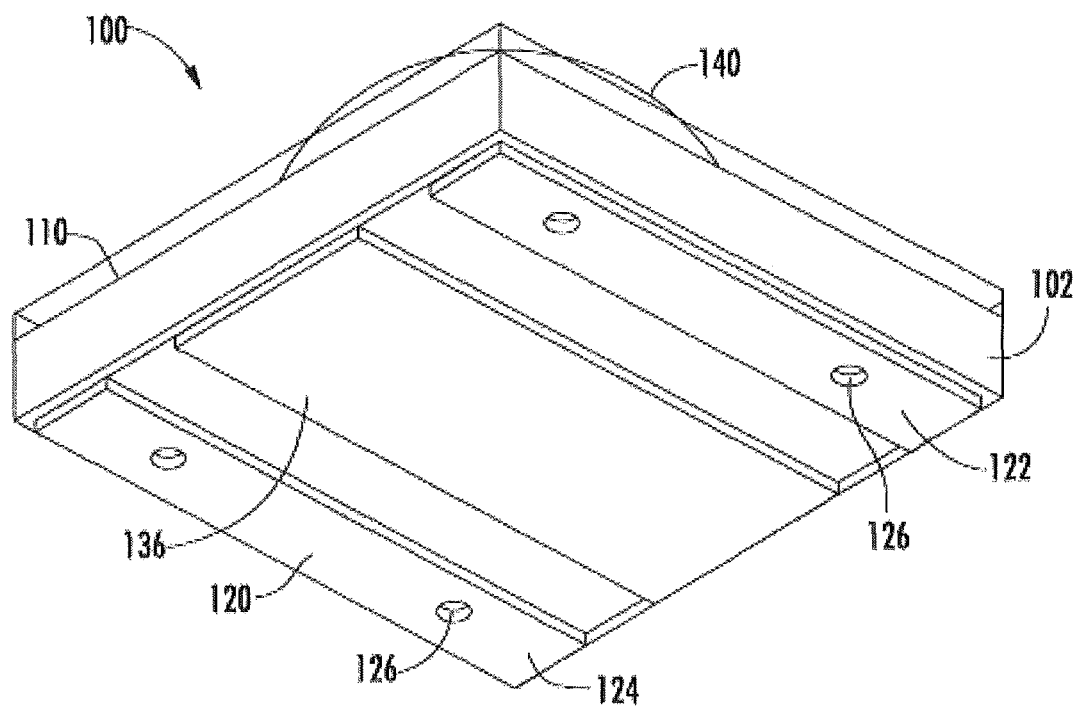

A solid state light emitting device 100 will now be described that includes a luminophoric medium according to embodiments of the present invention with reference to FIGS. 5A-5D. The solid state light emitting device 100 comprises a packaged LED. In particular, FIG. 5A is a perspective view of the solid state light emitting device 100 without a lens thereon. FIG. 5B is a perspective view of the device 100 viewed from the opposite side. FIG. 5C is a side view of the device 100 with a lens covering the LED chip. FIG. 5D is a bottom perspective view of the device 100.

As shown in FIG. 5A, the solid state light emitting device 100 includes a substrate/submount ("submount") 102 on which a single LED chip or "die" 104 is mounted. The submount 102 can be formed of many different materials such as, for example, aluminum oxide, aluminum nitride, organic insulators, a printed circuit board (PCB), sapphire or silicon. The LED 104 can have many different semiconductor layers arranged in different ways. LED structures and their fabrication and operation are generally known in the art and hence are only briefly discussed herein. The layers of the LED 104 can be fabricated using known processes such as, for example, metal organic chemical vapor deposition (MOCVD). The layers of the LED 104 may include at least one active layer/region sandwiched between first and second oppositely doped epitaxial layers all of which are formed successively on a growth substrate. Typically, many LEDs are grown on a growth substrate such as, for example, a sapphire, silicon carbide, aluminum nitride (AlN), or gallium nitride (GaN) substrate to provide a grown semiconductor wafer, and this wafer may then be singulated into individual LED dies, which are mounted in a package to provide individual packaged LEDs. The growth substrate can remain as part of the final singulated LED or, alternatively, the growth substrate can be fully or partially removed. In embodiments where the growth substrate remains, it can be shaped and/or textured to enhance light extraction.

It is also understood that additional layers and elements can also be included in the LED 104, including but not limited to buffer, nucleation, contact and current spreading layers as well as light extraction layers and elements. It is also understood that the oppositely doped layers can comprise multiple layers and sub-layers, as well as super lattice structures and interlayers. The active region can comprise, for example, a single quantum well (SQW), multiple quantum well (MQW), double heterostructure and/or super lattice structure. The active region and doped layers may be fabricated from different material systems, including, for example, Group-III nitride based material systems such as GaN, aluminum gallium nitride (AlGaN), indium gallium nitride (InGaN) and/or aluminum indium gallium nitride (AlInGaN). In some embodiments, the doped layers are GaN and/or AlGaN layers, and the active region is an InGaN layer.

The LED 104 may be an ultraviolet, violet or blue LED that emits radiation with a dominant wavelength in a range of about 380 nm to about 490 nm. As noted above, in some embodiments, a short wavelength blue LED having a peak wavelength between 440 nm and 455 nm may be used.

The LED 104 may include a conductive current spreading structure 106 on its top surface, as well as one or more contacts 108 that are accessible at its top surface for wire bonding. The spreading structure 106 and contacts 108 can both be made of a conductive material such as Au, Cu, Ni, In, Al, Ag or combinations thereof, conducting oxides and transparent conducting oxides. The current spreading structure 106 may comprise conductive fingers 107 that are arranged in a pattern on the LED 104 with the fingers spaced to enhance current spreading from the contacts 108 into the top surface of the LED 104. In operation, an electrical signal is applied to the contacts 108 through a wire bond as described below, and the electrical signal spreads through the fingers 107 of the current spreading structure 106 into the LED 104. Current spreading structures are often used in LEDs where the top surface is p-type, but can also be used for n-type materials.

The LED 104 may be coated with a luminophoric medium 109 according to embodiments of the present invention. As discussed above, this recipient luminophoric medium 109 may include particles of a green phosphor, particles of a yellow phosphor and particles of a red phosphor mixed therein (together and/or in separate layers). It will be understood that the recipient luminophoric medium 109 may comprise any of the recipient luminophoric mediums discussed in the present disclosure.

The recipient luminophoric medium 109 may include a binder material, and may have different concentrations or loading of phosphor materials in the binder, with a typical concentration being in range of 30-70% by weight. In one embodiment, the phosphor concentration is approximately 65% by weight, and may be generally uniformly dispersed throughout the binder. In other embodiments the recipient luminophoric medium 109 can comprise multiple layers of different concentrations or types of phosphors, and the multiple layers can comprise different binder materials. One or more of the layers can be provided without phosphors. For example, a first coat of clear silicone can be deposited followed by phosphor loaded layers. As another example, the coating may comprise, for example, a three layer coating that includes a first layer having a first phosphor that is coated directly on the LED chips 210, a second layer having a second phosphor that is coated directly on the first layer, and a third layer having a third phosphor that is coated directly on the second phosphor. Numerous other layer structures are possible, including multi-layers that include multiple phosphors in the same layer. Intervening layers or elements could also be provided between layers and/or between the coating and the underlying LED chips 104.

The recipient luminophoric medium 109 may be coated on the LED 104 using many different methods, with suitable methods being described in U.S. patent application Ser. Nos. 11/656,759 and 11/899,790, both entitled Wafer Level Phosphor Coating Method and Devices Fabricated Utilizing Method. Alternatively the recipient luminophoric medium 109 may be coated on the LED 104 using other methods such an electrophoretic deposition (EPD), with a suitable EPD method described in U.S. patent application Ser. No. 11/473,089 entitled Close Loop Electrophoretic Deposition of Semiconductor Devices.

An optical element or lens 140 (see FIGS. 5C-5D) is formed on the top surface 110 of the submount 102, over the LED 104, to provide both environmental and/or mechanical protection. The lens 140 can be molded using different molding techniques such as those described in U.S. patent application Ser. No. 11/982,275 entitled Light Emitting Diode Package and Method for Fabricating Same. The lens 140 can be many different shapes such as, for example, hemispheric. Many different materials can be used for the lens 140 such as silicones, plastics, epoxies or glass. The lens 140 can also be textured to improve light extraction. In some embodiments, the lens 140 may comprise the recipient luminophoric medium 109 and/or may be used to hold a luminophoric medium 109 in place over the LED 104 instead of and/or in addition to coating a luminophoric medium 109 directly onto the LED chip 104.

The top surface 110 of the submount 102 may have patterned conductive features that can include a die attach pad 112 with an integral first contact pad 114. A second contact pad 116 is also included on the top surface 110 of the submount 102 with the LED 104 mounted approximately at the center of the attach pad 112. The attach pad 112 and first and second contact pads 114, 116 may comprise metals or other conductive materials such as, for example, copper. The copper pads 112, 114, 116 may be plated onto a copper seed layer that is, in turn, formed on a titanium adhesion layer. The pads 112, 114, 116 may be patterned using standard lithographic processes. These patterned conductive features provide conductive paths for electrical connection to the LED 104 using known contacting methods. The LED 104 can be mounted to the attach pad 112 using known methods and materials.

A gap 118 (see FIG. 5A) is included between the second contact pad 116 and the attach pad 112 down to the surface of the submount 102. An electrical signal is applied to the LED 104 through the second pad 116 and the first pad 114, with the electrical signal on the first pad 114 passing directly to the LED 104 through the attach pad 102 and the signal from the second pad 116 passing into the LED 104 through wire bonds. The gap 118 provides electrical isolation between the second pad 116 and attach pad 112 to prevent shorting of the signal applied to the LED 104.

Referring to FIGS. 5C and 5D, an electrical signal can be applied to the package 100 by providing external electrical contact to the first and second contact pads 114, 116 via first and second surface mount pads 120, 122 that are formed on the back surface 124 of the submount 102 to be at least partially in alignment with the first and second contact pads 114, 116, respectfully. Electrically conductive vias 126 are formed through the submount 102 between the first mounting pad 120 and the first contact pad 114, such that a signal that is applied to the first mounting pad 120 is conducted to first contact pad 114. Similarly, conductive vias 126 are formed between the second mounting pad 122 and second contact pad 116 to conduct an electrical signal between the two. The first and second mounting pads 120, 122 allow for surface mounting of the LED package 100 with the electrical signal to be applied to the LED 104 applied across the first and second mounting pads 120, 122.

The pads 112, 114, 116 provide extending thermally conductive paths to conduct heat away from the LED 104. The attach pad 112 covers more of the surface of the submount 102 than the LED 104, with the attach pad extending from the edges of the LED 104 toward the edges of the submount 102. The contact pads 114, 116 also cover the surface of the submount 102 between the vias 126 and the edges of the submount 102. By extending the pads 112, 114, 116, the heat spreading from the LED 104 may be improved, which may improve the operating life of the LED and/or allow for higher operating power.

The LED package 100 further comprises a metalized area 136 on the back surface 124 of the submount 102, between the first and second mounting pads 120, 122. The metalized area 136 may be made of a heat conductive material and may be in at least partial vertical alignment with the LED 104. In some embodiments, the metalized area 136 is not in electrical contact with the elements on top surface of the submount 102 or the first and second mounting pads 120, 122 on the back surface of the submount 102. Although heat from the LED 104 is spread over the top surface 110 of the submount 102 by the attach pad 122 and the pads 114, 116, more heat will pass into the submount 102 directly below and around the LED 104. The metalized area 136 can assist with this dissipation by allowing this heat to spread into the metalized area 136 where it can dissipate more readily. The heat can also conduct from the top surface 110 of the submount 10, through the vias 126, where the heat can spread into the first and second mounting pads 120, 122 where it can also dissipate.

FIGS. 6A-6D and 7A-7D are charts that illustrate the improved CRI R9 performance that can be achieved with light emitting devices according to embodiments of the present invention. In FIGS. 6A-6D, "HIGH R9-1" refers to light emitting devices with the inventive green/red phosphor combinations with the LuAG:Ce green phosphor described above in combination with LEDs having a dominant wavelength of 464 nm, while "HIGH LF" refers to light emitting devices with the inventive green/yellow/red phosphor combination described herein. In FIGS. 10A-10D, "HIGH R9-2" refers to light emitting devices with the inventive green/red phosphor combinations with the LuAG:Ce green phosphor described above in combination with LEDs having a dominant wavelength of 458 nm, while "REFERENCE" refers to commercially available samples.

Figure 6A:
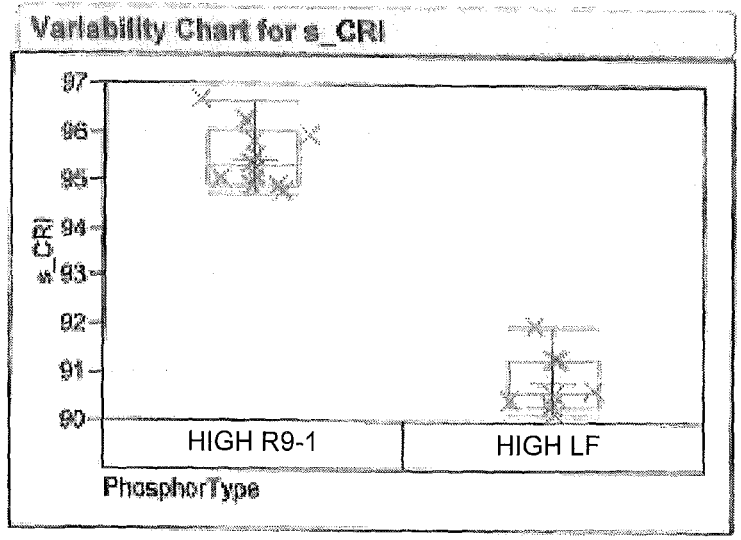
FIGS. 6A-6D and 7A-7D are charts that illustrate the improved CRI R9 performance that can be achieved with light emitting devices according to embodiments of the present invention.

FIGS. 6A to 6D compare the performance of the HIGH R9 devices with the HIGH LF devices. FIG. 6A shows that the HIGH R9 devices demonstrate higher CRI Ra results than the HIGH LF devices, with CRI Ra values greater than 94, and in some cases, greater than 95 or 96.

Figure 6B:
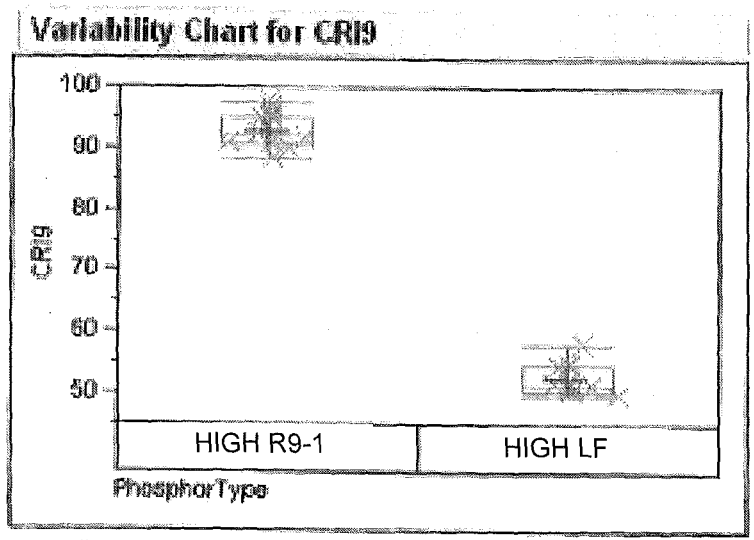

FIG. 6B shows that the HIGH R9 devices demonstrate higher CRI R9 results than the HIGH LF devices, with CRI R9 values greater than 85, and in some cases, greater than 90 or 95.

Figure 6C:
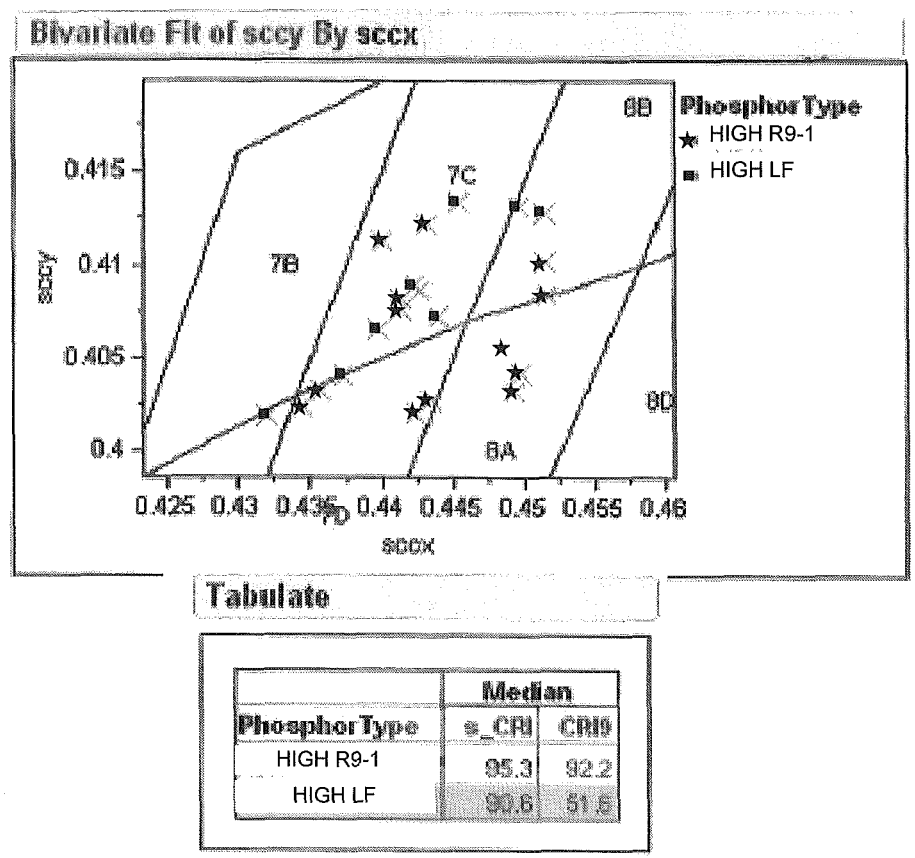

FIG. 6C is a graph of color points for various HIGH LF and HIGH R9 devices showing that the color points are similar for the devices.

Figure 6D:
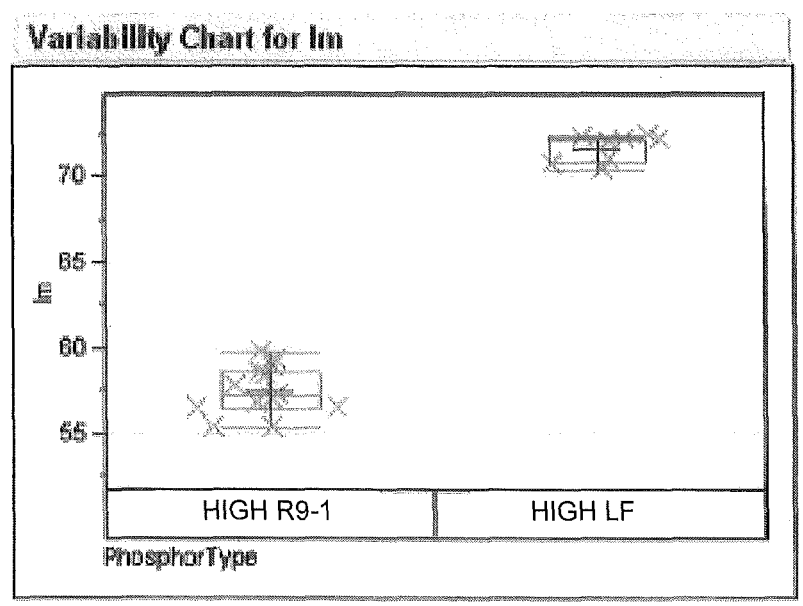

FIG. 6D shows that the luminous flux generated by the HIGH LF devices is higher than the HIGH R9 devices.

Figure 7A:
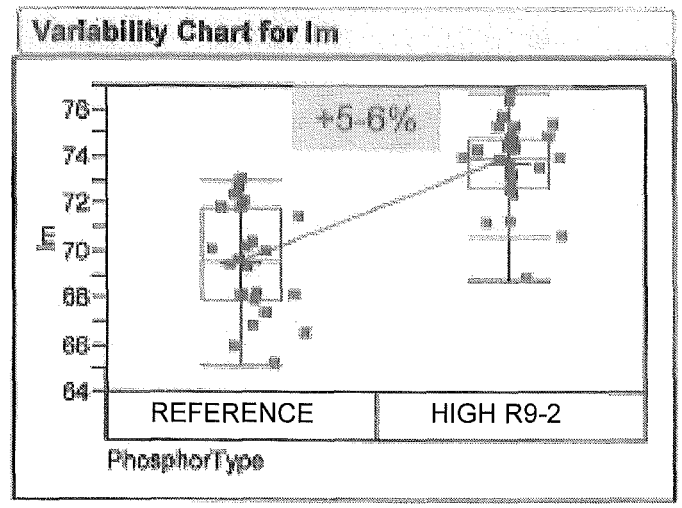

FIGS. 7A to 7D compare the performance of the HIGH R9 devices with commercially available samples. FIG. 7A shows that the HIGH R9-2 devices generate, on average, about 5%-6% more luminous flux than the REFERENCE devices.

Figure 7B:
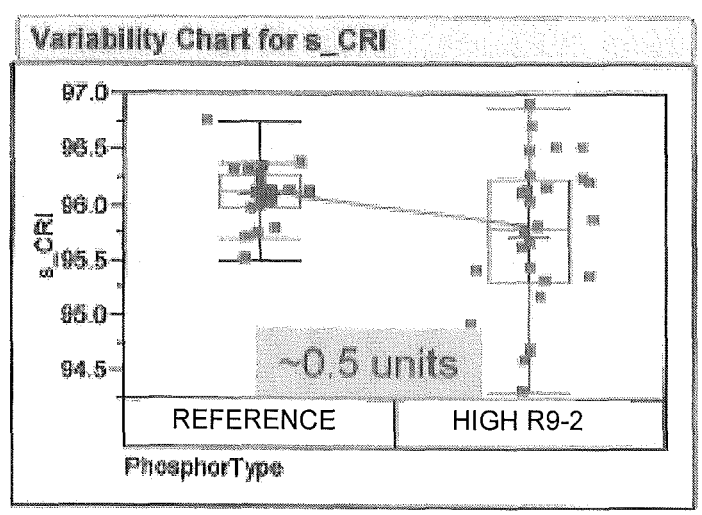

FIG. 7B shows that the HIGH R9-2 devices have slightly lower CRI Ra, on average, than the REFERENCE devices.

Figure 7C:
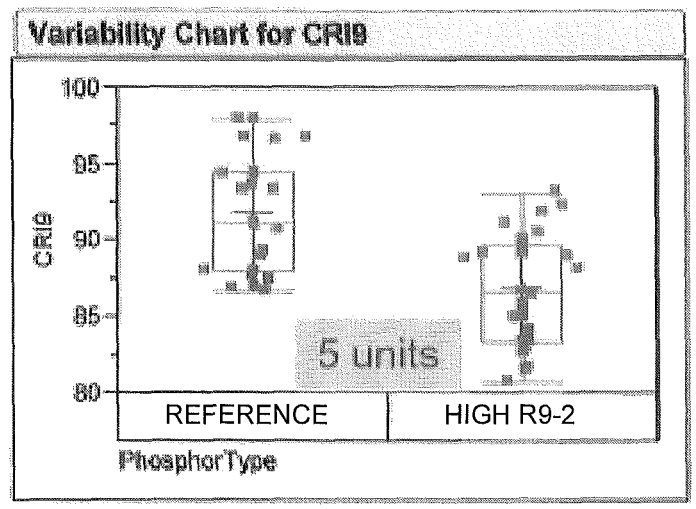
Figure 7D:
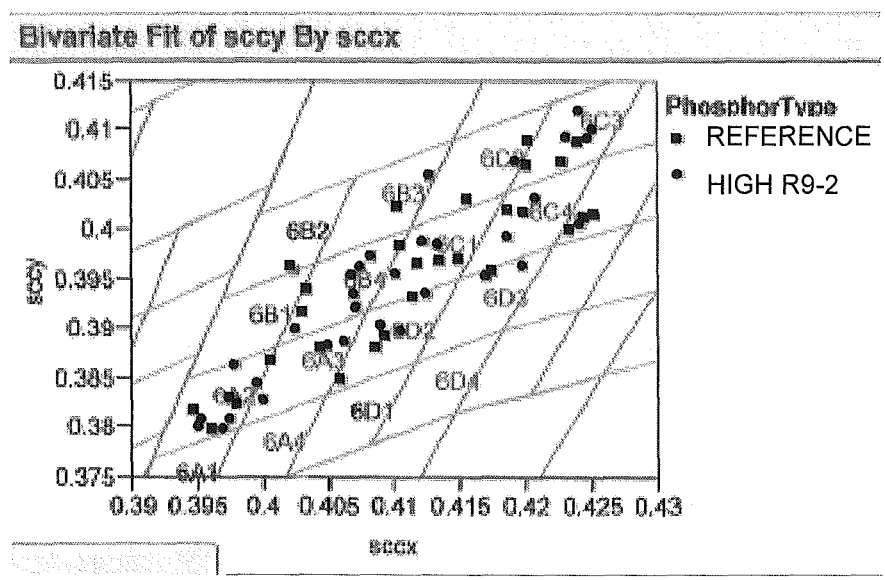

FIG. 7C shows that the REFERENCE devices have slightly higher CRI R9 performance on average than the HIGH R9-2 devices, while FIG. 7D shows that the REFERENCE and HIGH R9 devices have similar color point distributions.

Phosphors according to some embodiments may be utilized in many different types of devices and/or packages in addition to those described above. For example, phosphors according to some embodiments may be utilized in the devices and/or packages described in U.S. Publication No. 2012/0193649, entitled Light Emitting Diode (LED) Arrays Including Direct Die Attach And Related Assemblies, the disclosure of which is incorporated herein by reference in its entirety.

It is understood that although the present invention has been described with respect to LEDs having vertical geometries, it may also be applied to LEDs having other geometries such as, for example, to lateral LEDs that have both contacts on the same side of the LED chip.

In certain embodiments that are described above, the phosphor is shown as coated on the LED chips, for example in a silicone or other matrix material. It will be appreciated, however, that in other embodiments, the phosphor can be placed in and/or on an encapsulant and/or optic of the LED, such as silicone, epoxy or glass. The multiple phosphors can be mixed together in the matrix and/or positioned separately (in a remote phosphor configuration) on the optic and/or in discrete layers on the LED chip. In some embodiments, different colored LEDs or different LED chip or chips can be utilized.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

While embodiments of the present invention have primarily been discussed above with respect to solid state light emitting devices that include LEDs, it will be appreciated that according to further embodiments of the present invention, laser diodes and/or other solid state lighting devices may be provided that include the recipient luminophoric mediums discussed above. Thus, it will be appreciated that embodiments of the present invention are not limited to LEDs, but may include other solid state lighting devices such as laser diodes.

While specific phosphor combinations have been described above, it will be appreciated that other phosphor combinations may be used in alternative embodiments. By way of example, in other embodiments, the gallium substituted YAG:Ce phosphors could be replaced with a LuAG:Ce phosphor and vice-versa. Similarly, the YAG:Ce phosphor could be replaced with a yellow-light emitting nitride based phosphor. Thus, it will be appreciated that embodiments of the present invention are not limited to the specific examples described in the specification, but instead cover all embodiments that are within the scope of the appended claims.

The present invention has been described with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. The singular forms "a", "an" and "the" are intended to include the plural forms as well, unless the context clearly indicates otherwise. It will be further understood that, when used in this specification, the terms "comprises" and/or "including" and derivatives thereof, specify the presence of stated features, operations, elements, and/or components, but do not preclude the presence or addition of one or more other features, operations, elements, components, and/or groups thereof.

It will be understood that, although the terms first, second, etc. may be used herein to describe various elements, components, regions and/or layers, these elements, components, regions and/or layers should not be limited by these terms. These terms are only used to distinguish one element, component, region or layer from another element, component, region or layer. Thus, a first element, component, region or layer discussed below could be termed a second element, component, region or layer without departing from the teachings of the present invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure.

The expression "light emitting device," as used herein, is not limited, except that it be a device that is capable of emitting light.

What is claimed is:

1. A light emitting device, comprising:
   a light emitting diode ("LED") that emits light having a dominant wavelength in the blue color range; and
   a recipient luminophoric medium that is configured to down-convert at least some of the light emitted by the LED;
   wherein the recipient luminophoric medium comprises:
      a green phosphor that down-converts the radiation emitted by the LED to radiation having a peak wavelength that is between about 525 nanometers and about 550 nanometers;
      a yellow phosphor having a peak wavelength that is between about 550 nanometers and about 580 nanometers; and
      a red $(Ca_{1-x-y}Sr_xEu^{2+}{}_y)SiAlN_3$ phosphor, wherein the $(Ca_{1-x-y}Sr_xEu^{2+}{}_y)SiAlN_3$ phosphor has a europium content y of between about 0.003 and 0.010 and a strontium content x of between about 0.150 and 0300.

2. The light emitting device of claim 1, wherein the green phosphor comprises a $Y_aCe_bAl_cGa_dO_z$ phosphor ("gallium substituted YAG:Ce phosphor"), a $Lu_3Al_5O_{12}$:Ce phosphor ("LuAG:Ce phosphor"), or a combination of a gallium substituted YAG:Ce phosphor and a LuAG:Ce phosphor.

3. The light emitting device of claim 1, wherein the yellow phosphor comprises a $Y_aCe_bAl_cO_z$ phosphor ("YAG:Ce phosphor").

4. The light emitting device of claim 1, wherein the europium content of the $(Ca_{1-x}Sr_x)SiAlN_3$:$Eu^{2+}$ phosphor is between about 0.005 and 0.007.

5. The light emitting device of claim 1, wherein a ratio by weight of non red phosphor particles to red phosphor particles in the recipient luminophoric medium is from about 13:1 to about 4:1.

6. The light emitting device of claim 1, wherein the recipient luminophoric medium is free of YAG:Ce phosphors.

7. The light emitting device of claim 1, wherein the recipient luminophoric medium and the LED are configured to together emit white light having a correlated color temperature between about 2500K and about 4500K and a CRT R9 of at least 85.

8. The light emitting device of claim 1, wherein the LED emits light having a dominant wavelength between 440 nm and 465 nm.

9. The light emitting device of claim 1, wherein the recipient luminophoric medium and the LED is configured to together emit white light having a correlated color temperature of about 4000K, a CRI Ra that is greater than 90, and a CRI R9 that is greater than 85.

10. The light emitting device of claim 1, wherein the recipient luminophoric medium and the LED is configured to together emit white light having a correlated color temperature that is less than 4000K, a CRI Ra that is greater than 90, and a CRI R9 that is greater than 90.

11. A light emitting device, comprising:
    a light emitting diode that emits light having a dominant wavelength in the blue color range; and a recipient luminophoric medium that is configured to down-convert at least some of the light emitted by the LED;

wherein the recipient luminophoric medium includes a red $(Ca_{1-x-y}Sr_xEu^{2+}{}_y)SiAlN_3$ phosphor, wherein the $(Ca_{1-x-y}Sr_xEu^{2+}{}_y)SiAlN_3$ phosphor has a europium content y of between about 0.003 and 0.010 and a strontium content of between about 0.200 and 0.250.

12. The light emitting device of claim 11, wherein the device has a CRI Ra value that is greater than 95 and a CRI R9 value that is greater than 85.

13. The light emitting device of claim 12, wherein the device, has a CRI R9 value that is greater than 90.

14. The light emitting device of claim 13, wherein the device has a CRI R9 value that is greater than 95.

15. The light emitting device of claim 11, further comprising:

an additional phosphor that emits light other than red light when stimulated by radiation emitted by the LED.

16. The light emitting device of claim 15, wherein the additional phosphor comprises a green phosphor that down-converts the radiation emitted by the LED to radiation having a peak wavelength that is between about 525 nanometers and about 550 nanometers.

17. The light emitting device of claim 16, wherein the green phosphor comprises a gallium-substituted YAG:Ce phosphor and/or a LuAG:Ce phosphor.

18. The light emitting device of claim 15, wherein the additional phosphor comprises a yellow phosphor.

* * * * *

UNITED STATES PATENT AND TRADEMARK OFFICE
CERTIFICATE OF CORRECTION

PATENT NO. : 9,219,202 B2  
APPLICATION NO. : 14/255607  
DATED : December 22, 2015  
INVENTOR(S) : Wilcox et al.

Page 1 of 1

It is certified that error appears in the above-identified patent and that said Letters Patent is hereby corrected as shown below:

In the Specification:
Column 13, Line 67: Please correct "submount 10," to read -- submount 102, --

In the Claims:
Column 16, Claim 1, Line 29: Please correct "0300." to read -- 0.300. --
Column 16, Claim 7, Line 50: Please correct "a CRT R9 of"
           to read -- a CRI R9 of --
Column 17, Claim 13, Line 13: Please correct "device, has a"
           to read -- device has a --

Signed and Sealed this  
Twenty-eighth Day of June, 2016

Michelle K. Lee  
*Director of the United States Patent and Trademark Office*